United States Patent Office 3,782,961
Patented Jan. 1, 1974

3,782,961
PHOTOSENSITIVE COMPOSITION COMPRISING POLYURETHANE PREPOLYMER

Katsutoshi Takahashi and Masanori Takase, Urawa, Japan, assignors to Dainippon Ink and Chemicals, Incorporated, Tokyo, Japan No Drawing. Filed Mar. 30, 1971, Ser. No. 129,620
Claims priority, application Japan, Mar. 30, 1970, 45/25,894
Int. Cl. G03c *1/70*
U.S. Cl. 96—115 R 8 Claims

ABSTRACT OF THE DISCLOSURE

A photosensitive composition comprising a polyurethane prepolymer and a photosensitizer, the prepolymer being prepared by the reaction of a hydroxyl component having at least 5 ether linkages and an ethylenically unsaturated double bond positioned at the terminals with a polyisocyanate component.

This invention relates to a photosensitive composition suitable as a material for the production of better press printing plates and flexographic printing plates, which comprises a polyurethane prepolymer, a photosensitizer, and if desired, an ethylenically unsaturated monomer, the prepolymer being obtained by the reaction of a hydroxyl component containing at least 5 ether linkages and an ethylenically unsaturated double bond positioned at the terminals with a polyisocyanate component.

Flexographic printing is a method suitable for printing packaging materials such as cellophane, glassine paper, kraft paper, corrugated cardboard, polyethylene films, polypropylene films, polyvinyl chloride films, polyester films, or aluminum foils. With an increasing demand for packaging materials, flexographic printing has been needed more than ever.

In flexographic printing, rubber plates have been previously used. The rubber plates have been produced by a series of complicated process steps including the production of an original metal plate through the steps of graining the surface of a metal plate, coating a photosensitive solution on the surface of the metal plate, drying the coating, exposing and developing, strengthening the photocured film, and etching the plate, applying a matrix material to the metal plate and pressing it to form a matrix, and thereafter, fabricating and curing the rubber using this matrix.

As an improvement of this process, British Pat. 1,131,-617 discloses a method of producing flexographic printing plates of synthetic resin from a photosensitive composition by a simple operation, which comprises irradiating actinic rays onto a layer of a photosensitive composition containing an unsaturated polyester resin, a photosensitizer and a cross linking agent through a negative or positive film to photopolymerize the exposed part, removing the unexposed part by washing with water or an aqueous solution containing an acid, alkali or organic solvent, and developing the exposed part.

In the production of flexographic printing plates of synthetic resins, the photosensitive compositions to be used must meet the following requirements.

(1) The exposed portion of the photosensitive composition should be photopolymerized by the application of actinic light to a rubbery elastomer insoluble in organic solvents.

(2) The unexposed part of the photosensitive composition should be readily soluble in water or an aqueous solution of an acid, alkali, or organic solvent, and the exposed portion should be easily developed.

(3) Re-exposure can be effected with simple operation after the development in order to increase the strength of the resulting flexographic plates.

(4) The flexographic printing plates formed by the photopolymerization of the photosensitive composition should have good abrasion resistance.

(5) The resulting flexographic printing plates should not be swollen or dissolved by printing ink.

(6) Printing ink should adhere well to the flexographic printing plates, and the ink transfer from the flexographic plates to the material to be printed should be excellent.

The photosensitive composition disclosed in British patent specification 1,131,617 has the tendency that its photopolymerization is retarded by the presence of oxygen in air. The re-exposing of the developed flexographic plate should be performed in nitrogen gas. This is a complicated procedure. Furthermore, since the photosensitive composition contains a great amount of ester linkage due to the unsaturated polyester resin, the resulting flexographic plate has poor resistance to alkalies, and is liable to be attacked by an alkaline printing ink.

Accordingly, it is an object of the present invention to provide a photosensitive composition having all the properties described above.

It has been found that a photosensitive composition comprising a polyurethane prepolymer, a photosensitizer, and if desired, and ethylenically unsaturated monomer, the prepolymer being obtained by the reaction of a hydroxyl component containing at least 5 ether linkages and an ethylenically unsaturated double bond positioned at the terminals with a polyisocyanate component meets the above-mentioned object of the invention. As the hydroxyl component mentioned above, the use of a hydroxyl compound having at least 5 ether linkages and an ethylenically unsaturated double bond at the terminals (hydroxyl Compound A for short) is most convenient. It is also possible to use a combination of a hydroxyl compound having at least 5 ether linkages (hydroxyl Compound B for short) and a hydroxyl compound having an ethylenically unsaturated double bond positioned at the terminals (hydroxyl Compound C for short), or a combination of Compound A and hydroxyl Compound B and/or hydroxyl Compound C.

When actinic rays are irradiated onto a layer of the photosensitive composition of the present invention, through a negative or positive film, the unexposed portion can be removed by dissolving it in water or an aqueous solution of an acid, alkali, or organic solvent, but the exposed portion undergoes photopolymerization and becomes a rubbery elastomer which is insoluble in water, an aqueous solution of an acid, alkali, organic solvent, and also in organic solvents. The photosensitive composition of the invention can be photopolymerized in the presence of oxygen. The flexographic plates produced from this photosensitive composition have superior resistance to alkalies. Therefore, the photosensitive composition of the present invention has removed all of the defects of the photosensitive composition disclosed in the British patent specification 1,131,617, and can fully exhibit the properties (1) to (6) described above.

As previously stated, the photosensitive composition of the invention is soluble in water or an aqueous solution containing an acid, alkali or organic solvent before being photopolymerized, but when photopolymerized, it becomes a rubbery elastomer which is no longer soluble in water or the aforementioned aqueous solution or in organic solvents. This is due to the presence of 5 or more ether linkages which are due to the hydroxyl compound A or hydroxyl compound B in the hydroxyl component.

Examples of the hydroxyl Compound A are:

polypropylene glycol monomethacrylates of the formula $$CH_2{=}\underset{CH_3}{\underset{|}{C}}{-}COO\left(CH_2\underset{CH_3}{\underset{|}{C}}HO\right)_nH$$

($n$ is an integer of 6 to 200)

polyethylene glycol monomethacrylates of the formula $$CH_2{=}\underset{CH_3}{\underset{|}{C}}{-}COO(CH_2CH_2O)_nH$$

($n$ is an integer of 6 to 200)

polypropylene glycol monoacrylates of the formula $$CH_2{=}CHCOO\left(CH_2\underset{CH_3}{\underset{|}{C}}HO\right)_nH$$

($n$ is an integer of 6 to 200)

polyethylene glycol monoacrylates of the formula $$CH_2{=}CHCOO(CH_2CH_2O)_nH$$

($n$ is an integer of 6 to 200)

or hydroxyl compounds of the general formula $$\begin{array}{l} \qquad\qquad CH_2O\left(CH_2\underset{CH_3}{\underset{|}{C}}HO\right)_nH \\ \qquad\qquad | \\ CH_3CH_2{-}C{-}CH_2O\left(CH_2\underset{CH_3}{\underset{|}{C}}HO\right)_mH \\ \qquad\qquad | \\ \qquad\qquad CH_2O\left(CH_2\underset{CH_3}{\underset{|}{C}}HO\right)_l OC\underset{CH_3}{\underset{|}{C}}{=}CH_2 \end{array}$$

($l$, $m$ and $n$ are each zero or a positive integer, and satisfy the relation of $l+m+n$ is an integer of 5 to 200).

These hydroxyl compounds may be used either alone or in combination.

Examples of the hydroxyl Compound B include:

polyethylene glycols of the formula $$HO(CH_2CH_2O)_nH$$

($n$ is an integer of 6 to 200)

polypropylene glycols of the formula $$HO\left(CH_2\underset{CH_3}{\underset{|}{C}}HO\right)_nH$$

($n$ is an integer of 6 to 200)

polytetramethylene glycols of the formula $$HO(CH_2CH_2CH_2CH_2O)_nH$$

($n$ is an integer of 6 to 200)

polyoxyethylated glycerols of the formula $$\begin{array}{l} CH_2O(CH_2CH_2O)_lH \\ | \\ CHO(CH_2CH_2O)_mH \\ | \\ CH_2O(CH_2CH_2O)_nH \end{array}$$

($l$, $m$ and $n$ are each zero or a positive integer, and satisfy the relation of $l+m+n$ being an integer of 5 to 200);

polyoxypropylated glycerol of the formula $$\begin{array}{l} CH_2O\left(CH_2\underset{CH_3}{\underset{|}{C}}HO\right)_lH \\ | \\ CHO\left(CH_2\underset{CH_3}{\underset{|}{C}}H_2O\right)_mH \\ | \\ CH_2O\left(CH_2\underset{CH_3}{\underset{|}{C}}HO\right)_nH \end{array}$$

($l$, $m$ and $n$ are the same as defined above);

polyoxyethylated trimethylolpropanes of the formula $$\begin{array}{l} \qquad\qquad CH_2O(CH_2CH_2O)_lH \\ \qquad\qquad | \\ CH_3CH_2{-}C{-}CH_2O(CH_2CH_2O)_mH \\ \qquad\qquad | \\ \qquad\qquad CH_2O(CH_2CH_2O)_nH \end{array}$$

($l$, $m$, and $n$ are the same as defined above);

polyoxypropylated trimethylolpropanes of the formula $$\begin{array}{l} \qquad\qquad CH_2O\left(CH_2\underset{CH_3}{\underset{|}{C}}HO\right)_lH \\ \qquad\qquad | \\ CH_3CH_2{-}C{-}CH_2O\left(CH_2\underset{CH_3}{\underset{|}{C}}HO\right)_mH \\ \qquad\qquad | \\ \qquad\qquad CH_2O\left(CH_2\underset{CH_3}{\underset{|}{C}}HO\right)_nH \end{array}$$

($l$, $m$, and $n$ are the same as defined above);

hydroxyl compounds of the formula $$HO(CH_2CH_2O)_l\left(CH_2\underset{CH_3}{\overset{|}{C}}HO\right)_m(CH_2CH_2O)_nH$$

($l$, $m$, and $n$ are each a positive integer of at least 1 and satisfy the relation of $l+m+n$ being an integer of 5 to 200), or polyoxetane compounds such as poly[3,3-bis(chloromethyl)oxyacyclobutane] of the formula $$HO\left(CH_2\overset{CH_2Cl}{\underset{CH_2Cl}{C}}CH_2O\right)_nH$$

($n$ is an integer of 6 to 200).

These hydroxyl Compounds B may be used either alone or in combination.

That the prepolymer of the present invention can be photopolymerized even in the presence of oxygen in air is due to the presence of an ethylenically unsaturated double bond at the terminals which is due to the hydroxyl Compound A or hydroxyl Compound C in the hydroxyl component of the prepolymer.

Examples of the hydroxyl Compound C include 2-hydroxyethyl acrylate, 2-hydroxyethyl methacrylate, 2-hydroxypropyl acrylate, 2-hydroxypropyl methacrylate, N-hydroxymethyl acrylamide, N-hydroxymethyl methacrylamide, diethylene glycol monoacrylate, diethylene glycol monomethacrylate, hydroxystyrene, glycerol dimethacrylate, an equimolar reaction product of glycidyl methacrylate and acrylic acid, trimethylol propane dimethacrylate, trimethylpropane monomethacrylate, pentaerythritol trimethacrylate, pentaerythritol dimethacrylate, pentaerythritol monomethacrylate, allyl alcohol, 2-bromoallyl alcohol, or 2-chloroallyl alcohol. These hydroxyl Compounds C may be used either alone or in combination.

The preparation of the hydroxyl component containing at least 5 ether linkages and an ethylenically unsaturated double bond is basically performed by using the hydroxyl Compound A, or a combination of the hydroxyl Compound B and the hydroxyl Compound C. If desired, the hydroxyl Compound A may be used conjointly with the hydroxyl Compound B and/or the hydroxyl Compound C. Moreover, in order to control the hardness, flexibility, abrasion resistance or solvent resistance of the intended flexophaphic plate, another hydroxyl compound (to be referred to as the hydroxyl Compound (D) different from the hydroxyl Compounds A, B and C described above may be used as part of the hydroxyl component of the prepolymer of the invention.

Examples of the hydroxyl Compound D that can be used in the invention include octyl alcohol, decyl alcohol, tridecyl alcohol, stearyl alcohol, ethylene glycol monoethyl ether, ethylene glycol, propylene glycol, diethylene glycol, dipropylene glycol, triethylene glycol, 1,3-butylene glycol, 1,4-butylene glycol, neopentyl glycol, trimethylolpropane monoacetate, glycerol, trimethylolpropane, trimethylolethane, pentaerythritol, and sorbitol. These hydroxyl Compounds D may be used either alone or in combination.

In the present invention, the ethylenically unsaturated double bond contained in the prepolymer is restricted to that positioned at the terminals. This is because of the necessity of enabling the photosensitive composition containing the prepolymer to be photopolymerized even in air. The especially preferred ethylenically unsaturated double bonds are those based on an acryloyl group, methacryloyl group or ethacryloyl group expressed by the general formula $$CH_2{=}\underset{\substack{|\\ R}}{C}COO-$$

wherein R is a hydrogen atom or a methyl or ethyl group.

The polyisocyanate component to be reacted with the hydroxyl component to form the prepolymer is a compound having at least 2 isocyanate groups in the molecule. Examples of such polyisocyanate compounds are 2,4-tolylenediisocyanate, 2,6-tolylenediisocyanate, xylylene diisocyanate, 3,3′-dimethyldiphenylmethane-4,4′-diisocyanate, 2,4-tolylenediisocyanate dimer, 1,5-naphthylene diisocyanate, a triphenyl urethane reaction product between hexanetriol and 2,4-tolylene diisocyanate, a triphenyl urethane reaction product between trimethylolpropane and 2,4-tolylene diisocyanate, metaphenylene diisocyanate, triphenylmethane-4,4′,4″-triisocyanate, hexamethylene diisocyanate, a biuret compound of hexamethylene diisocyanate compound. These polyisocyanate compounds may be used either alone or in combination. If desired, a monoisocyanate compound having one isocyanate in the molecule such as phenyl isocyanate, n-butyl isocyanate, n-octyl isocyanate, stearyl isocyanate or methoxyethyl isocyanate may be used in the preparation of the prepolymer together with the polyisocyanate compounds described.

The ether linkage possessed by the hydroxyl Compound A and the hydroxyl Compound B (both of these will be generically termed "polyether-type hydroxyl compound" hereinafter) serves to increase the solubility of the photosensitive composition in water or an aqueous solution, and also to impart rubbery elasticity to the flexographic printing plate obtained. In order to achieve the aforementioned effects fully by using the hydroxyl Compound C and the hydroxyl Compound D together with the polyether-type hydroxyl compound, it is desirable to use the polyether-type hydroxyl compound in an amount of at least $$\frac{M}{M+0.8E}\times 100 \text{ mole percent}$$

based on the total amount of the hydroxyl compounds. In the above equation, M is an average molecular weight of the hydroxyl Compounds C and D. If there are $n_1, n_2 \ldots n_i$ moles of the hydroxyl compounds having a molecular weight of $m_1, m_2 \ldots m_i$, then $$M=\frac{\Sigma m_i n_i}{\Sigma n_i}$$

and E is an average molecular weight of the polyether-type hydroxyl compounds. If there are $n_1, n_2 \ldots n_j$ moles of polyether-type hydroxyl compounds having a molecular weight of $e_1, e_2 \ldots e_j$, then $$E=\frac{\Sigma e_j n_j}{\Sigma n_i}$$

For example, when polyethylene glycol having an average molecular weight of 1,540 (hydroxyl Compound B), polyethylene glycol having an average molecular weight of 200 (hydroxyl Compound D), and 2-hydroxyethyl methacrylate (hydroxyl Compound C) are used at a molar ratio of 1:9, $$\frac{M}{M+0.8E}\times 100=\frac{137}{137+0.8\times 1540}\times 100 \doteqdot 10.0$$

Therefore, it is desirable to use at least 10.0 mole percent of polyethylene glycol having an average molecular weight of 1540 based on the total amount of the hydroxyl component of the prepolymer. As another example, when triethylene glycol (hydroxyl Compound D) and polyethylene glycol monomethacrylate having an average molecular weight of 468 (hydroxyl Compound A) are used as the hydroxyl component, $$\frac{M}{M+0.8E}\times 100=\frac{150}{150+0.8\times 468}\times 100=28.6$$

It is therefore desirable to use polyethylene glycol monomethacrylate having an average molecular weight of 468 in an amount of at least 28.6 mole percent based on the total weight of the hydroxyl component. As still another example, when 2-hydroxyethyl acrylate (hydroxyl Compound C) and polyethylene glycol monomethacrylate having an average molecular weight of 1000 (hydroxyl Compound A) are used as the hydroxyl component, $$\frac{M}{M+0.8E}\times 100=\frac{116}{116+0.8\times 1000}\times 100=12.7$$

Therefore, it is desirable to use at least 12.7 mole percent of polyethylene glycol monomethacrylate having an average molecular weight of 1000 based on the total weight of the hydroxyl component.

The photocuring properties of the intended photosensitive composition, although being affected by the type and amount of the photosensitizer conjointly used with the prepolymer and the type and amount of the ethylenically unsaturated monomer used as required, have close relation with the amount of the ethylenically unsaturated double bonds at the terminals which the hydroxyl Compound A and/or the hydroxyl Compound C has. When the total amount of the hydroxyl component and the polyisocyanate component used in the preparation of the prepolymer is W grams and there are $n_1, n_2 \ldots n_k$ moles of the hydroxyl Compound A and/or the hydroxyl Compound C each having $N_1, N_2 \ldots N_k$ ethylenically unsaturated double bonds at their terminals, a value is expressed by the equation $$\phi=\frac{W}{\Sigma N_k n_k}$$

If $\phi$ is in excess of 9,000, it is very difficult to cure the photosensitive composition within a short period of time, and the resistance to chemicals of the resulting flexographic printing plate becomes abruptly poor. When a far superior printing durability is required to the flexographic plate, it is desirable to adjust the value of $\phi$ to below 7,000.

The ratio of the hydroxyl component to the polyisocyanate component exerts serious effects on the solubility of the photosensitive composition in water or an aqueous solution containing an acid, alkali or organic solvent, its viscosity, its shelf life, and the physical properties of the flexographic printing plate. Generally, it is desirable to react both of these components so that the following relation exists $$0.85 \leqq \frac{H}{I} \leqq 2.3$$

wherein H is the number of hydroxyl groups contained in the hydroxyl component, and I is the number of isocyanate groups contained in the polyisocyanate component.

When unreacted active isocyanate groups remain in the resulting prepolymer, the concentration of the isocyanate groups should be adjusted to below 0.5% by weight based on the total weight of the photosensitive composition.

In order to effect the reaction of producing the prepolymer smoothly, an organic solvent or ethylenically unsaturated monomer (to be described later in more detail) which will not react with the isocyanate and hydroxyl groups may be present in the reaction system. The organic solvent preferably has a low boiling point since it must be removed after the completion of reaction. Examples of such organic solvent are methyl ethyl ketone, ethyl acetate, propyl acetate, tetrahydrofuran, dioxane, diisopropyl ether, methyl isobutyl ketone, benzene or toluene. The organic solvents may be used either alone or in combination.

The reaction temperature may be higher than room temperature, and is such that the polymerization reaction based on the unsaturated double bonds present in the reaction system will not be promoted. Unnecessarily high temperatures should be avoided because such high temperatures involve the gelation of the reaction product. In general, the reaction temperature is from 40° to 120° C., preferably from 50° to 90° C.

For accelerating the rate of reaction, a catalyst such as a quaternary ammonium salt or an organotin compound may be present in the reaction system. A polymerization inhibitor may also be added in order to inhibit the polymerization of the ethylenically unsaturated double bonds contained in the reaction system during the production of the prepolymer. Examples of such polymerization inhibitor include benzoquinone, 2,5-diphenyl-p-benzoquinone, hydroquinone, hydroquinone monomethyl ether, catechol or p-ter-butyl catechol. The amount of polymerization inhibitor is 0.005 to 1.000% by weight based on the total weight of the ethylenically unsaturated monomer added to the reaction system as required and the prepolymer to be produced.

Examples of the photosensitizer that is incorporated with the prepolymer to form the photosensitive composition of the invention include diketones such as benzil and diacetyl; benzoin and derivatives thereof such as benzoin, benzoin methyl ether, benzoin ethyl ether, benzoin butyl ether and alpha-methylbenzoin; organic sulfides such as diphenyl monosulfide, diphenyl disulfide, desyl phenyl sulfide, and tetramethylthiuram monosulfide; S-acyldithiocarbamates such as S-benzoyl-N,N-dimethyldithiocarbamate and S-(p-chlorobenzoyl)-N,N-dimethyl dithiocarbamate; phenones such as acetophenone, benzophenone, p-bromobenzophenone and 4,4'-bis(dimethylamino)benzophenone; and organic sulfonyl chlorides such as benzenesulfonyl chloride, o-toluenesulfonyl chloride and 2-naphthalenesulfonyl chloride. Colors such as eosine and thionine may also be used. The amount of photosensitizer is from 0.001 to 10% based on the total weight of the photosensitive composition.

Examples of the ethylenically unsaturated monomer that is incorporated in the prepolymer and photosensitizer when it is necessary for imparting better workability to the photosensitive composition or improving the physical properties of the flexographic plate, include styrene, chlorostyrene, alpha-methyl styrene, divinyl benzene, methyl methacrylate, n-butyl methacrylate, n-butyl acrylate, n-propyl acrylate, n-propyl methacrylate, isopropyl methacrylate, isopropyl acrylate, n-hexyl acrylate, 2-ethylhexyl acrylate, 2-ethylhexyl methacrylate, amyl acrylate, acrylonitrile, ethylene glycol dimethacrylate, ethylene glycol diacrylate, triethylene glycol dimethacrylate, triethylene glycol diacrylate, diallylphthalate, diallyl isophthalate, vinyl acetate or vinyl butyrate, which are not reactive with the isocyanate groups.

As previously stated, such ethylenically unsaturated monomer may be added to the reaction system in order to perform the reaction smoothly. In this case, the monomer need not to be separated from the prepolymer after the completion of reaction, unlike the organic solvent, and therefore, it is more convenient. Furthermore, as the ethylenically unsaturated monomer, those ethylenically unsaturated monomers which do react with the isocyanate groups, such as acrylic acid, methacrylic acid, acrylamide, methacrylamide or the hydroxyl compound A or C may be used. In this case, the monomer is added after the production of the prepolymer, or together with the hydroxyl component in the final step of producing the prepolymer.

The hardness of the flexographic printing plate produced by photopolymerizing the photosensitive composition of the present invention has close relation with the type and amount of the ethylenically unsaturated monomer. Generally, the ratio of the prepolymer to the ethylenically unsaturated monomer is from 100:0 to 40:60, preferably from 100:0 to 60:40.

When actinic rays having a wavelength of 1800 to 7000 A. are irradiated on the photosensitive composition so obtained, the composition readily polymerizes to a rubbery elastomer having excellent resistance to water and chemicals. The light source to be used at this time may be any which can generate actinic rays having a wavelength of 1800 to 7000 A. For example, an ultraviolet-fluorescent lamp, low pressure mercury lamps, high pressure mercury lamps, ultrahigh pressure mercury lamps or carbon arc lamps may be cited.

Flexographic printing plates can be produced from the photosensitive composition of the present invention with a very simple operation. One example of the production will be shown below.

A photosensitive element is first prepared by superposing a support sheet (ii), a layer of the photosensitive composition (iii), a transparent film (iv), a negative or positive film (v) and a glass plate (vi) on a glass plate (1) in this order. The glass plates (i) and (vi) may preferably be of polished glass sheet of soda glass, Pyrex glass or quartz glass having a thickness of about 0.5 to 10 mm. When a part of the photosensitive composition layer (iii) is photopolymerized, the photocured composition serves as the support sheet (ii), and therefore the support sheet (ii) is not always necessary. The support sheet (ii) may be used in view of economy and the ease of mounting the flexographic plate onto the printing cylinder. The support sheet (ii) may, for example, be a rubber sheet, plastic film, metal plate, or woven cloth, etc. The thickness of the photosensitive composition layer (iii) may be 0.1 to 10 mm. The transparent film (iv) is not always necessary, but may be used for rendering the separation of the negative or positive film (v) from the photosensitive composition layer (iii) easy, and preventing any injury to the negative or positive film (v). Suitable examples of such film include cellophane, polyester films, polyethylene films, polypropylene films or polyvinyl chloride films. Thereafter, actinic rays are irradiated from above through the glass plate (vi), and the negative or positive film (v). Then the exposed portion of the photosensitive composition layer (iii) is photopolymerized to form a rubbery elastomer insoluble in water or an aqueous solution containing an acid, alkali or organic solvent, which forms an image area. Where the support sheet (ii) is not used, actinic light is irradiated from below also, so that the lower layer of the layer (iii) is photopolymerized to a rubbery elastomer which can be a substitute for the support sheet (ii). The unexposed portion is then removed by dissolving it in water or an aqueous solution containing an acid, alkali or organic solvent, thereby forming a non-image area. Thus, the intended flexographic printing plate is produced.

In order to increase the strength of the flexographic printing plate, it is finally re-exposed to actinic light. Since the flexographic plate can be fully photopolymerized even in the presence of oxygen, this re-exposing operation can be performed with a simple operation in air. Of course, this operation can be performed in a stream of an inert gas such as nitrogen gas.

The flexographic printing plate produced from the photosensitive composition of the present invention has good printability, resistance to water, acid, and organic solvents, and has especially good alkali resistance as compared with the conventional flexographic printing plates of synthetic resin. The photosensitive composition of the invention also finds applications as materials for producing various photo-marked substances such as name plates, scribed panels and the like.

The following examples will further illustrate the present invention.

EXAMPLES 1 TO 3

Tolylene diisocyanate (2,4-tolylene diisocyanate/2,6-tolylene-diisocyanate=80/20) 348 grams (2.0 moles) was heated to 70° C. With care taken not to raise this temperature, 1000 g. of polyethylene glycol having an average molecular weight of 1000 heated at 70° C. were added dropwise in the course of one hour, and the reaction was performed for 5 hours. Thereafter, a solution of 286 g. (2.2 moles) of 2-hydroxyethyl methacrylate and 0.286 g. of p-benzoquinone were added dropwise over a period of 0.5 hour. The reaction was performed for additional 7 hours to form a light yellow transparent prepolymer.

To the resulting prepolymer 10 g. of each of the ethylenically unsaturated monomers indicated in Table I and 1 g. of benzoin methyl ether were added. These were uniformly mixed to form three kinds of photosensitive compositions.

A photosensitive element was prepared by superposing a 3.0 mm. thick layer of photosensitive composition (iii), an 18-micron thick polyester film (iv), a negative film (v), and a 5.0 mm. thick polished glass plate (vi) on a 5.0 mm. thick polished glass plate (i) in this order.

Actinic rays were irradiated onto the glass plates (i) and (vi) from a high pressure mercury lamp (800 w.) at a distance 35 cm. from the glass plate. The exposure time is 6 minutes for glass plate (vi), and 3 minutes for the glass plate (i).

After exposure, the photosensitive composition layer (iii) was developed with water at 25° C. to form a rubbery elastomer having a vivid relief image, namely, flexographic printing plate.

For strengthening the flexographic plate, it was irradiated with actinic rays for 5 minutes in the air from a high pressure mercury lamp placed at a distance 35 cm. away to give each of the flexographic plates a Shore hardness (A) as shown in Table I.

Using each of the resulting flexographic printing plates, printing was performed from an aqueous flexographic ink or oleophilic flexographic ink on a corrugated board, kraft paper, cellophane, and polyethylene film. The transfer of printing ink is better than in the case of using rubber printing plates, and the flexographic plate had excellent printability.

TABLE I

| Example number | Ethylenically unsaturated monomer | Shore hardness (A) |
|---|---|---|
| 1 | Methyl methacrylate | 93 |
| 2 | n-Butyl methacrylate | 80 |
| 3 | Ethyl methacrylate | 75 |

EXAMPLES 4 TO 9

Each of the ethylenically unsaturated monomers indicated in Table II was added to each of the prepolymers prepared from the materials indicated in Table II to form a prepolymer solution. To the solution 1% by weight, based on the total weight, of benzoin methyl ether was added. The materials were uniformly mixed with one another to form a photosensitive composition.

Using such of the photosensitive compositions, a flexographic printing plate was produced in the same manner as set forth in Examples 1 to 3. The flexographic plate obtained had good rubbery elasticity and a Shore hardness (A) indicated in Table II.

TABLE II

| Example number | Hydroxyl compounds used (g.) | | | | Polyisocyanate compound (g.) | Ethylenically unsaturated monomer (g.) | Shore hardness (A) |
|---|---|---|---|---|---|---|---|
| | A | B | C | D | | | |
| 4 | | PEG 2000 (2,000) | 2 HEMA (286) | | TDI (348) | | 60 |
| 5 | | PEG 2000 (2,000) | 2 HEMA (286) | | TDI (348) | MMA (292) | 79 |
| 6 | | PEG 2000 (2,000) | 2 HEA (255) | | TDI (348) | EA (325 | 48 |
| 7 | | PEG 1540 (1,230) | 2 HEA (255) | DPG (26.8) | TDI (376) | EA (210)) | 65 |
| 8 | | Polyglycol 15-200" (2,600) | 2 HEMA (429) | | TDI (522) | EA (400) | 68 |
| 9 | Blenmer PE-400 (1,030) | | | | TDI (174) | BMA (130) | 77 |
| 10 | Blenmer PE-400 (400) | PEG 1540 (770) | CHPMA (98) | TMP (67) | TDI (348) | EA (525), TMPTMA (41) | 90 |
| 11 | Blenmer PE-400 (440) | PEG 1540 (770) | | | TDI (174) | EA (325), AA (11) | 62 |

The following abbreviations have been used in Table II.

PEG 1540=polyethylene glycol with an average molecular weight of 1,540; PEG 2000=polyethylene glycol with an average molecular weight of 2,000; Polyglycol 15-200=polyether polyol with an average molecular weight of 2,600 (product of Dow Chemical Corporation); Blenmer PE 400=polyethylene glycol monomethacrylate with an average molecular weight of 400 (product of Nippon Oil and Fats Co., Ltd.); 2 HEMA=2-hydroxyethyl methacrylate; 2 HEA=2-hydroxyethyl acrylate; DPG=dipropylene glycol; TDI=tolylene diisocyanate (isomer ratio 2,4-/2,6-=80/20); XDI=xylylene diisocyanate (isomer ratio m-/p-=70-75/30-25); NMA=methyl methacrylate; EA=ethyl acrylate; BMA=n-butyl-methacrylate; CHPMA=3-chloro-2-hydroxypropyl methacrylate; AA=acrylic acid; TMPTMA=trimethylolpropane trimethacrylate; TMP=trimethylolpropane.

EXAMPLE 12

A photosensitive composition was prepared in the same way as set forth in Example 1 except that 10 g. of a mixture of trimethylol propane trimethacrylate and triethylene glycol diacrylate (weight ratio of 7:3) were used instead of the methyl methacrylate.

A photosensitive element was produced by superposing a 2.0 mm. thick surface-roughened polyurethane rubber (ii), a 1.0 mm. thick layer of the photosensitive composition obtained above (iii), a 12 micron thick polyester film (iv), a negative film (v) and a glass plate (vi) on a glass plate (i) in this order.

Actinic rays were irradiated onto the glass plate (vi) for 5 minutes from a high pressure mercury lamp (800 w.) placed at a distance 35 cm. away. The exposed portion was developed with water at 25° C. A flexographic printing plate having a relief image with rubbery elasticity on a polyurethane rubber was obtained.

The relief image was re-exposed in air to actinic rays, and it had a Shore hardness (A) of 89 after re-exposure.

What we claim is:

1. A photosensitive composition comprising a polyurethane prepolymer and a photosensitizer, said prepolymer being prepared by the reaction of a hydroxy component (I) selected from (i) a hydroxy Compound A having at least 5 ether linkages and an ethylenically unsaturated double bond expressed by the formula $$CH_2=\underset{\substack{| \\ R}}{C}COO-$$

wherein R is a hydrogen atom or a methyl or ethyl group, (ii) a combination of said hydroxy Compound A and a hydroxy Compound B having at least 5 ether linkages,
(iii) a combination of said hydroxyl Compound A and a hydroxyl Compound C having an ethylenically unsaturated double bond expressed by the formula $$CH_2{=}\underset{\displaystyle R}{\underset{|}{C}}COO{-}$$

wherein R is a hydrogen atom or a methyl or ethyl group,
(iv) a combination of said hydroxy Compounds B and C, and
(v) a combination of said hydroxyl Compounds A, B and C with a polyisocyanate component (II).

2. A photosensitive composition comprising a polyurethane prepolymer, a photosensitizer and an ethylenically unsaturated monomer, said prepolymer being prepared by the reaction of a hydroxyl component (I) selected from
(i) a hydroxy Compound A having at least 5 ether linkages and an ethylenically unsaturated double bond expressed by the formula $$CH_2{=}\underset{\displaystyle R}{\underset{|}{C}}COO{-}$$

wherein R is a hydrogen atom or a methyl or ethyl group,
(ii) a combination of said hydroxyl Compound A and a hydroxyl Compound B having at least 5 ether linkages,
(iii) a combination of said hydroxyl Compound A and a hydroxy Compound C having an ethylenically unsaturated double bond expressed by the formula $$CH_2{=}\underset{\displaystyle R}{\underset{|}{C}}COO{-}$$

wherein R is a hydrogen atom or a methyl or ethyl group,
(iv) a combination of said hydroxyl Compounds B and C, and
(v) a combination of said hydroxyl Compounds A, B and C with a polyisocyanate component (II).

3. The photosensitive composition of claim 1, wherein said hydroxyl Compound A is selected from the group consisting of
(a) polypropylene glycol monomethacrylates of the formula $$CH_2{=}\underset{\displaystyle CH_3}{\underset{|}{C}}{-}COO(CH_2\underset{\displaystyle CH_3}{\underset{|}{C}}HO)_nH$$

(wherein $n$ is an integer of 6 to 200)
(b) polyethylene glycol monomethacrylates of the formula $$CH_2{=}\underset{\displaystyle CH_3}{\underset{|}{C}}{-}COO(CH_2CH_2O)_nH$$

(wherein $n$ is an integer of 6 to 200),
(c) polypropylene glycol monoacrylates of the formula $$CH_2{=}CHCOO\left(CH_2\underset{\displaystyle CH_3}{\underset{|}{C}}HO\right)_nH$$

(wherein $n$ is an integer of 6 to 200),
(d) polyethylene glycol monoacrylates of the formula $$CH_2{=}CHCOO(CH_2CH_2O)_nH$$

(wherein $n$ is an integer of 6 to 200), and
(e) hydroxyl compounds of the formula

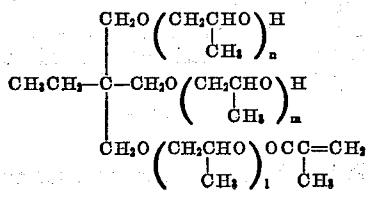

(wherein $l$, $m$ and $n$ are each zero or a positive integer, and satisfy the relation of $l+m+n$ is an integer of 5 to 200).

4. The photosensitive composition of claim 2, wherein said hydroxyl Compound A is selected from the group consisting of
(a) polypropylene glycol monomethacrylates of the formula $$CH_2{=}\underset{\displaystyle CH_3}{\underset{|}{C}}{-}COO\left(CH_2\underset{\displaystyle CH_3}{\underset{|}{C}}HO\right)_nH$$

(wherein $n$ is an integer of 6 to 200),
(b) polyethylene glycol monomethacrylates of the formula $$CH_2{=}\underset{\displaystyle CH_3}{\underset{|}{C}}{-}COO(CH_2CH_2O)_nH$$

(wherein $n$ is an integer of 6 to 200),
(c) polypropylene glycol monoacrylates of the formula $$CH_2{=}CHCOO\left(CH_2\underset{\displaystyle CH_3}{\underset{|}{C}}HO\right)_nH$$

(wherein $n$ is an integer of 6 to 200),
(d) polyethylene glycol monoacrylates of the formula $$CH_2{=}CHCOO(CH_2CH_2O)_nH$$

(wherein $n$ is an integer of 6 to 200), and
(e) hydroxyl compounds of the formula

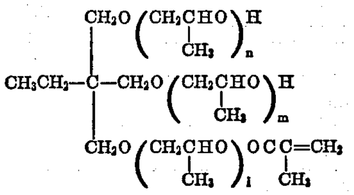

(wherein $l$, $m$ and $n$ are each zero or a positive integer, and satisfy the relation of $l+m+n$ is an integer of 5 to 200).

5. The photosensitive composition of claim 1, wherein said hydroxyl Compound C is selected from the group consisting of 2-hydroxyethyl acrylate, 2-hydroxyethyl methacrylate, 2-hydroxypropyl acrylate, 2-hydroxypropyl methacrylate, diethylene glycol monoacrylate, diethylene glycol monomethacrylate, glycerol dimethacrylate, an equimolar reaction product of glycidyl methacrylate and acrylic acid, trimethylol propane dimethacrylate, trimethylpropane monomethacrylate, pentaerythritol trimethacrylate, pentaerythritol and pentaerythritol monomethacrylate.

6. The photosensitive composition of claim 2, wherein said hydroxyl Compound C is selected from the group consisting of 2-hydroxyethyl acrylate, 2-hydroxyethyl methacrylate, 2-hydroxypropyl acrylate, 2-hydroxypropyl methacrylate, diethylene glycol monoacrylate, diethylene glycol monomethacrylate, glycerol dimethacrylate, an equimolar reaction product of glycidyl methacrylate and acrylic acid, trimethylol propane dimethacrylate, trimethylpropane monomethacrylate, pentaerythritol trimethacrylate, pentaerythritol dimethacrylate and pentaerythritol monomethacrylate.

7. The photosensitive composition of claim 1, wherein said hydroxyl Compound B is selected from the group consisting of
(a) polyethylene glycols of the formula $$HO(CH_2CH_2O)_nH$$

(wherein $n$ is an integer of 6 to 200),
(b) polypropylene glycols of the formula $$HO\left(CH_2\underset{\displaystyle CH_3}{\underset{|}{C}}HO\right)_nH$$

(wherein $n$ is an integer of 6 to 200), (c) polytetramethylene glycols of the formula $$HO(CH_2CH_2CH_2O)_nH$$

(wherein $n$ is an integer of 6 to 200), (d) polyoxyethylated glycerols of the formula $$\begin{array}{l} CH_2O(CH_2CH_2O)_lH \\ | \\ CH_2O(CH_2CH_2O)_mH \\ | \\ CH_2O(CH_2CH_2O)_nH \end{array}$$

(wherein $l$, $m$ and $n$ are each zero or a positive integer, and satisfy the relation of $l+m+n$ is an integer of 5 to 200), (e) polyoxypropylated glycerol of the formula $$\begin{array}{l} CH_2O(CH_2\underset{CH_3}{\underset{|}{C}}HO)_lH \\ | \\ CHO\left(CH_2\underset{CH_3}{\underset{|}{C}}H_2O\right)_mH \\ | \\ CH_2O\left(CH_2\underset{CH_3}{\underset{|}{C}}HO\right)_nH \end{array}$$

(wherein $l$, $m$ and $n$ are as defined above), (f) polyoxyethylated trimethylolpropanes of the formula $$\begin{array}{l} \qquad\quad CH_2O(CH_2CH_2O)_lH \\ \qquad\quad | \\ CH_3CH_2-C-CH_2O(CH_2CH_2O)_mH \\ \qquad\quad | \\ \qquad\quad CH_2O(CH_2CH_2O)_nH \end{array}$$

(wherein $l$, $m$ and $n$ are as defined above), (g) polyoxypropylated trimethylolpropanes of the formula $$\begin{array}{l} \qquad\quad CH_2O\left(CH_2\underset{CH_3}{\underset{|}{C}}HO\right)_lH \\ \qquad\quad | \\ CH_3CH_2-C-CH_2O\left(CH_2\underset{CH_3}{\underset{|}{C}}HO\right)_mH \\ \qquad\quad | \\ \qquad\quad CH_2O\left(CH_2\underset{CH_3}{\underset{|}{C}}HO\right)_nH \end{array}$$

(wherein $l$, $m$ and $n$ are as defined above), (h) hydroxyl compounds of the formula $$HO(CH_2CH_2O)_l\left(CH_2\overset{CH_3}{\overset{|}{C}}HO\right)_m(CH_2CH_2O)_nH$$

(wherein $l$, $m$ and $n$ are each a positive integer of at least 1 and satisfy the relation of $l+m+n$ *is* integer of 5 to 200), and (i) poly(3,3-bischloromethyloxyacrylobutane) of the formula $$HO\left(CH_2\overset{CH_2Cl}{\overset{|}{\underset{CH_2Cl}{\underset{|}{C}}}}CH_2O\right)_nH$$

(wherein $n$ is an integer of 6 to 200).

8. The photosensitive composition of claim 2, wherein said hydroxyl Compound B is selected from the group consisting of (a) polyethylene glycols of the formula $$HO(CH_2CH_2O)_nH$$

(wherein $n$ is an integer of 6 to 200), (b) polypropylene glycols of the formula $$HO\left(CH_2\underset{CH_3}{\underset{|}{C}}HO\right)_nH$$

(wherein $n$ is an integer of 6 to 200), (c) polytetramethylene glycols of the formula $$HO(CH_2CH_2CH_2CH_2O)_nH$$

(wherein $n$ is an integer of 6 to 200), (d) polyoxyethylated glycerols of the formula $$\begin{array}{l} CH_2O(CH_2CH_2O)_lH \\ | \\ CH_2O(CH_2CH_2O)_mH \\ | \\ CH_2O(CH_2CH_2O)_nH \end{array}$$

(wherein $l$, $m$ and $n$ are each zero or a positive integer, and satisfy the relation of $l+m+n$ is an integer of 5 to 200), (e) polyoxypropylated glycerol of the formula $$\begin{array}{l} CH_2O(CH_2\underset{CH_3}{\underset{|}{C}}HO)_lH \\ | \\ CHO\left(CH_2\underset{CH_3}{\underset{|}{C}}H_2O\right)_mH \\ | \\ CH_2O\left(CH_2\underset{CH_3}{\underset{|}{C}}HO\right)_nH \end{array}$$

(wherein $l$, $m$ and $n$ are as defined above), (f) polyoxyethylated trimethylolpropanes of the formula $$\begin{array}{l} \qquad\quad CH_2O(CH_2CH_2O)_lH \\ \qquad\quad | \\ CH_3CH_2-C-CH_2O(CH_2CH_2O)_mH \\ \qquad\quad | \\ \qquad\quad CH_2O(CH_2CH_2O)_nH \end{array}$$

(wherein $l$, $m$ and $n$ are as defined above), (g) polyoxypropylated trimethylolpropanes of the formula $$\begin{array}{l} \qquad\quad CH_2O\left(CH_2\underset{CH_3}{\underset{|}{C}}HO\right)_lH \\ \qquad\quad | \\ CH_3CH_2-C-CH_2O\left(CH_2\underset{CH_3}{\underset{|}{C}}HO\right)_mH \\ \qquad\quad | \\ \qquad\quad CH_2O\left(CH_2\underset{CH_3}{\underset{|}{C}}HO\right)_nH \end{array}$$

(wherein $l$, $m$ and $n$ are as defined above), (h) hydroxyl compounds of the formula $$HO(CH_2CH_2O)_l\left(CH_2\overset{CH_3}{\overset{|}{C}}HO\right)_m(CH_2CH_2O)_nH$$

(wherein $l$, $m$ and $n$ are each a positive integer of at least 1 and satisfy the relation of $l+m+n$ is an integer of 5 to 200), and (i) poly(3,3-bischloromethyloxyacrylobutane) of the formula $$HO\left(CH_2\overset{CH_2Cl}{\overset{|}{\underset{CH_2Cl}{\underset{|}{C}}}}CH_2O\right)_nH$$

(wherein $n$ is an integer of 6 to 200).

References Cited

UNITED STATES PATENTS

| | | | |
|---|---|---|---|
| 3,645,730 | 2/1972 | Frank et al. | 96—35.1 |
| 2,948,611 | 8/1960 | Barney | 96—35.1 |
| 3,556,791 | 1/1971 | Suzuki et al. | 96—35.1 |
| 3,644,120 | 2/1972 | Kai et al. | 96—115 |
| 3,658,531 | 4/1972 | Kurtz | 96—35.1 |

RONALD H. SMITH, Primary Examiner

U.S. Cl. X.R.

96—35.1, 115 P; 204—159.14, 159.15, 159.16

UNITED STATES PATENT OFFICE

CERTIFICATE OF CORRECTION

Patent No. 3,782,961 Dated January 1, 1974

Inventor(s) Katsutoshi TAKAHASHI ET AL

It is certified that error appears in the above-identified patent and that said Letters Patent are hereby corrected as shown below:

IN THE CLAIMS:

Column 10, lines 67 and 69; Column 11, lines 1, 2, 10, 19 and 29: cancel "hydroxy" and substitute therefor --hydroxyl--

Column 11, claim 3: cancel the formula (c) thereof and substitute the following formula therefor:

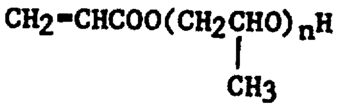

Column 11, claim 3: cancel the formula (e) thereof and substitute the following formula therefor:

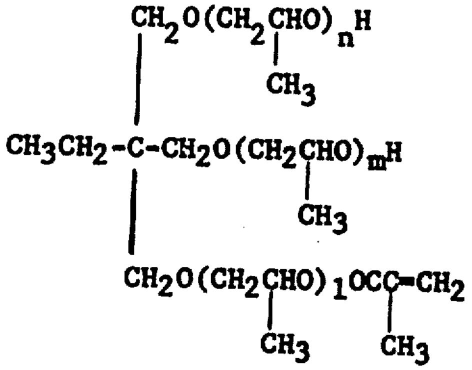

UNITED STATES PATENT OFFICE

CERTIFICATE OF CORRECTION

Patent No. 3,782,961 Dated January 1, 1974

Inventor(s) Katsutoshi TAKAHASHI ET AL

It is certified that error appears in the above-identified patent and that said Letters Patent are hereby corrected as shown below:

Column 12, claim 4: cancel the formula (c) thereof and substitute the following formula therefor:

$$CH_2=CHCOO(CH_2\underset{\displaystyle CH_3}{\underset{|}{C}}HO)_nH$$

Column 12, claim 4: cancel the formula (e) thereof and substitute the following formula therefor:

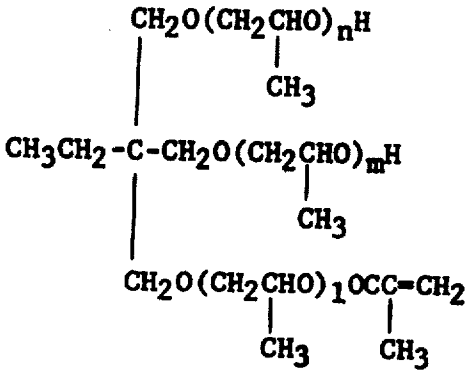

Column 12, claim 7: cancel the formula (b) thereof and substitute the following formula therefor:

$$HO(CH_2\underset{\displaystyle CH_3}{\underset{|}{C}}HO)_nH$$

UNITED STATES PATENT OFFICE

CERTIFICATE OF CORRECTION

Patent No. 3,782,961 Dated January 1, 1974

Inventor(s) Katsutoshi TAKAHASHI ET AL

It is certified that error appears in the above-identified patent and that said Letters Patent are hereby corrected as shown below:

Column 13, claim 7: cancel the formula (c) thereof and substitute the following formula therefor:

$$HO(CH_2CH_2CH_2CH_2O)_nH$$

Column 13, claim 7: cancel the formula (e) thereof and substitute the following formula therefor:

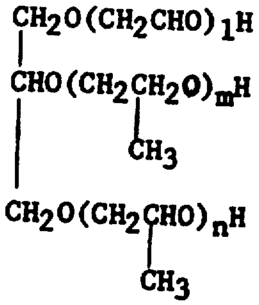

Column 13, claim 7: cancel the formula (f) thereof and substitute the following formula therefor:

UNITED STATES PATENT OFFICE

CERTIFICATE OF CORRECTION

Patent No. 3,782,961 Dated January 1, 1974

Inventor(s) Katsutoshi TAKAHASHI ET AL

It is certified that error appears in the above-identified patent and that said Letters Patent are hereby corrected as shown below:

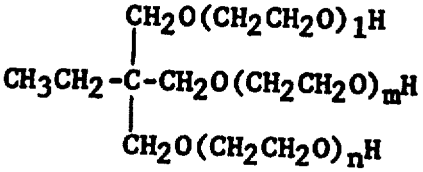

Column 13, claim 7: cancel the formula (g) thereof and substitute the following formula therefor:

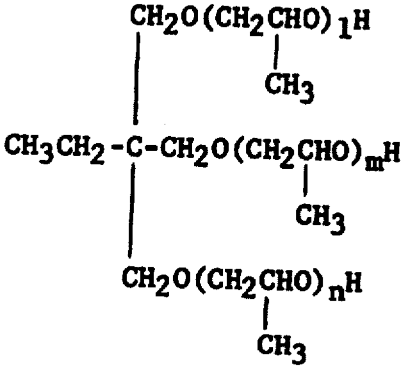

Column 13, claim 7: cancel the formula (h) thereof and substitute the following formula therefor:

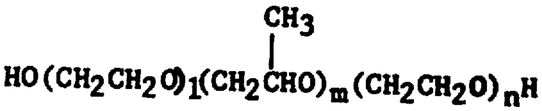

UNITED STATES PATENT OFFICE

CERTIFICATE OF CORRECTION

Patent No. 3,782,961 Dated January 1, 1974

Inventor(s) Katsutoshi TAKAHASHI ET AL

It is certified that error appears in the above-identified patent and that said Letters Patent are hereby corrected as shown below:

Column 12, Claim 7: cancel the formula (i) thereof and substitute the following formula therefor:

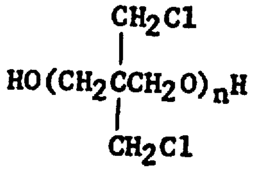

Column 13, Claim 8: cancel the formula (b) thereof and substitute the following formula therefor:

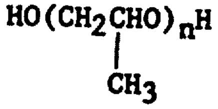

Column 14, Claim 8: cancel the formula (e) thereof and substitute the following formula therefor:

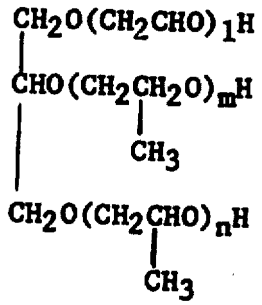

UNITED STATES PATENT OFFICE
CERTIFICATE OF CORRECTION

Patent No. 3,782,961 Dated January 1, 1974

Inventor(s) Katsutoshi TAKAHASHI ET AL

It is certified that error appears in the above-identified patent and that said Letters Patent are hereby corrected as shown below:

Column 14, Claim 8: cancel the formula (g) thereof and substitute the following formula therefor:

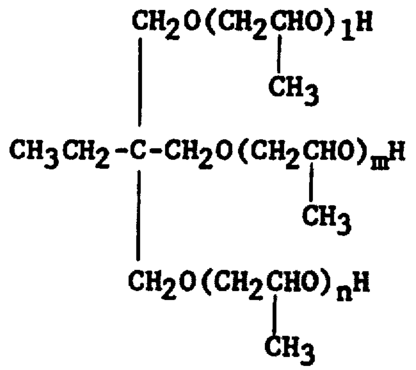

Column 14, Claim 8: cancel the formula (i) thereof and substitute the following formula therefor:

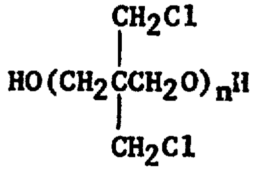

Signed and sealed this 16th day of July 1974.

(SEAL)
Attest:

McCOY M. GIBSON, JR.
Attesting Officer

C. MARSHALL DANN
Commissioner of Patents